(12) United States Patent
Damodaran et al.

(10) Patent No.: US 9,075,743 B2
(45) Date of Patent: Jul. 7, 2015

(54) MANAGING BANDWIDTH ALLOCATION IN A PROCESSING NODE USING DISTRIBUTED ARBITRATION

(75) Inventors: Raguram Damodaran, Plano, TX (US); Abhijeet Ashok Chachad, Plano, TX (US); Dheera Balasubramanian, Richardson, TX (US); Roger Kyle Castille, Houston, TX (US); David Quintin Bell, Frederick, MD (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 396 days.

(21) Appl. No.: 13/237,749

(22) Filed: Sep. 20, 2011

(65) Prior Publication Data

US 2012/0290756 A1    Nov. 15, 2012

Related U.S. Application Data

(60) Provisional application No. 61/387,283, filed on Sep. 28, 2010.

(51) Int. Cl.
     *G06F 13/16*      (2006.01)
     *G06F 11/10*      (2006.01)
     (Continued)

(52) U.S. Cl.
CPC ............ *G06F 11/1064* (2013.01); *G06F 7/483* (2013.01); *G06F 9/3012* (2013.01); *H03M 13/353* (2013.01); *H03M 13/2903* (2013.01); *G06F 13/1605* (2013.01); *G06F 13/1652* (2013.01); *G06F 13/1657* (2013.01); *G06F 13/1663* (2013.01); *G06F 13/18* (2013.01); *G06F 13/364* (2013.01); *H03K 19/0016* (2013.01); *G06F 1/3296* (2013.01); *H03K 21/00* (2013.01); *G06F 12/0246* (2013.01);
(Continued)

(58) Field of Classification Search
CPC ............ G06F 13/1605; G06F 13/1652; G06F 13/1657; G06F 13/1663; G06F 13/18; G06F 13/364
USPC .................................................. 710/243, 244
See application file for complete search history.

(56) References Cited

U.S. PATENT DOCUMENTS 5,729,702 A *   3/1998   Creedon et al. ................ 710/111
5,956,493 A *   9/1999   Hewitt et al. ................... 710/113
(Continued)

OTHER PUBLICATIONS

"TMS320C6678 Multicore Fixed and Floating-Point Digital Signal Processor", Data Manual, SPRS691, Texas Instruments Incorporated, Nov. 2010, pp. 1-259.

*Primary Examiner* — Ryan Stiglic
(74) *Attorney, Agent, or Firm* — Robert D. Marshall, Jr.; Frank D. Cimino

(57) ABSTRACT

Management of access to shared resources within a system comprising a plurality of requesters and a plurality of target resources is provided. A separate arbitration point is associated with each target resource. An access priority value is assigned to each requester. An arbitration contest is performed for access to a first target resource by requests from two or more of the requesters using a first arbitration point associated with the first target resource to determine a winning requester. The request from the winning requester is forwarded to a second target resource. A second arbitration contest is performed for access to the second target resource by the forwarded request from the winning requester and requests from one or more of the plurality of requesters using a second arbitration point associated with the second target resource.

12 Claims, 9 Drawing Sheets

(51) Int. Cl.

| | | |
|---|---|---|
| *G06F 7/483* | (2006.01) | |
| *G06F 9/30* | (2006.01) | |
| *H03M 13/35* | (2006.01) | |
| *H03M 13/29* | (2006.01) | |
| *G06F 13/18* | (2006.01) | |
| *H03K 19/00* | (2006.01) | |
| *G06F 1/32* | (2006.01) | |
| *H03K 21/00* | (2006.01) | |
| *G06F 12/02* | (2006.01) | |
| *G06F 13/364* | (2006.01) | |

(52) U.S. Cl.
CPC ............. *Y02B 60/32* (2013.01); *Y02B 60/1214* (2013.01); *Y02B 60/1285* (2013.01)

(56) References Cited

U.S. PATENT DOCUMENTS

| | | | |
|---|---|---|---|
| 6,092,137 A * | 7/2000 | Huang et al. ................. 710/111 |
| 6,119,196 A * | 9/2000 | Muller et al. ................. 710/243 |
| 6,226,702 B1 * | 5/2001 | Yakashiro ..................... 710/107 |
| 7,051,133 B2 * | 5/2006 | Takata ........................... 710/111 |
| 7,120,714 B2 * | 10/2006 | O'Connor et al. ............ 710/243 |
| 7,149,829 B2 * | 12/2006 | Weber et al. .................. 710/243 |
| 7,284,080 B2 * | 10/2007 | Lin et al. ....................... 710/244 |
| 7,302,510 B2 * | 11/2007 | Fredrickson et al. ......... 710/243 |
| 7,305,507 B2 * | 12/2007 | Lavigne ........................ 710/120 |
| 7,761,529 B2 * | 7/2010 | Choubal et al. ............... 709/212 |
| 7,809,889 B2 * | 10/2010 | Nychka et al. ................ 711/122 |
| 7,818,546 B2 * | 10/2010 | Asano et al. .................. 712/220 |
| 2004/0059879 A1 * | 3/2004 | Rogers ........................... 711/154 |
| 2004/0243752 A1 * | 12/2004 | O'Connor et al. ............ 710/243 |
| 2006/0184747 A1 * | 8/2006 | Guthrie et al. ................ 711/146 |
| 2007/0073949 A1 * | 3/2007 | Fredrickson et al. ......... 710/243 |
| 2008/0059674 A1 * | 3/2008 | Shi et al. ....................... 710/243 |
| 2008/0091866 A1 * | 4/2008 | Cox et al. ..................... 710/243 |
| 2009/0055566 A1 * | 2/2009 | Reinig et al. .................. 710/243 |
| 2009/0210660 A1 * | 8/2009 | Webber ......................... 712/205 |

* cited by examiner

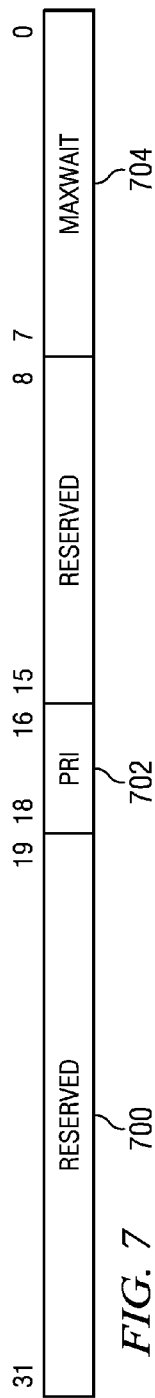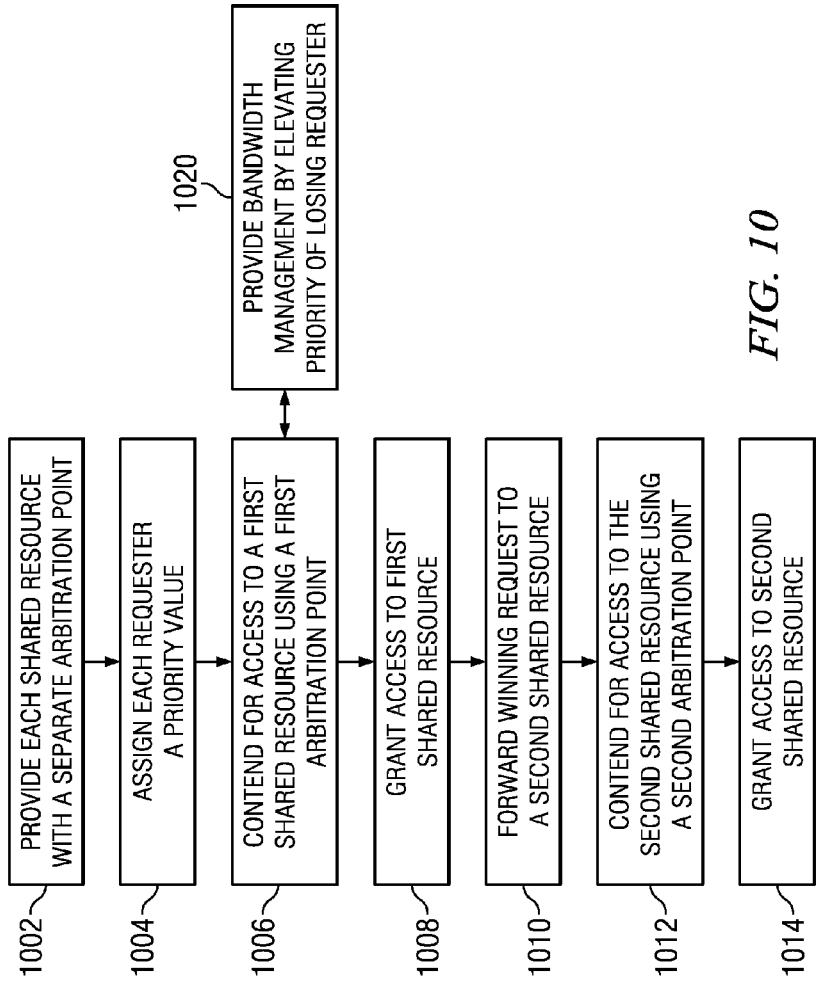

US 9,075,743 B2

MANAGING BANDWIDTH ALLOCATION IN A PROCESSING NODE USING DISTRIBUTED ARBITRATION

CLAIM OF PRIORITY UNDER 35 U.S.C. 119(e)

The present application claims priority to and incorporates by reference U.S. Provisional Application No. 61/387,283, filed Sep. 28, 2010, entitled Cache Controller Architecture.

FIELD OF THE INVENTION

This invention generally relates to management of memory access by multiple requesters, and in particular to access to a shared memory resource in a system on a chip with multiple cores.

BACKGROUND OF THE INVENTION

System on Chip (SoC) is a concept that strives to integrate more and more functionality into a given device. This integration can take the form of both hardware and solution software. Performance gains are traditionally achieved by increased clock rates and more advanced processor nodes. Many SoC designs pair a digital signal processor (DSP) with a reduced instruction set computing (RISC) processor to target specific applications. A more recent approach to increasing performance has been to create multi-core devices. In this scenario, management of competition for processing resources is typically resolved using a priority scheme.

BRIEF DESCRIPTION OF THE DRAWINGS

Particular embodiments in accordance with the invention will now be described, by way of example only, and with reference to the accompanying drawings:

FIG. 7 illustrates a priority value register;

FIG. 10 is a flow diagram illustrating operation of distributed arbitration for access to shared resources.

Figure 1:
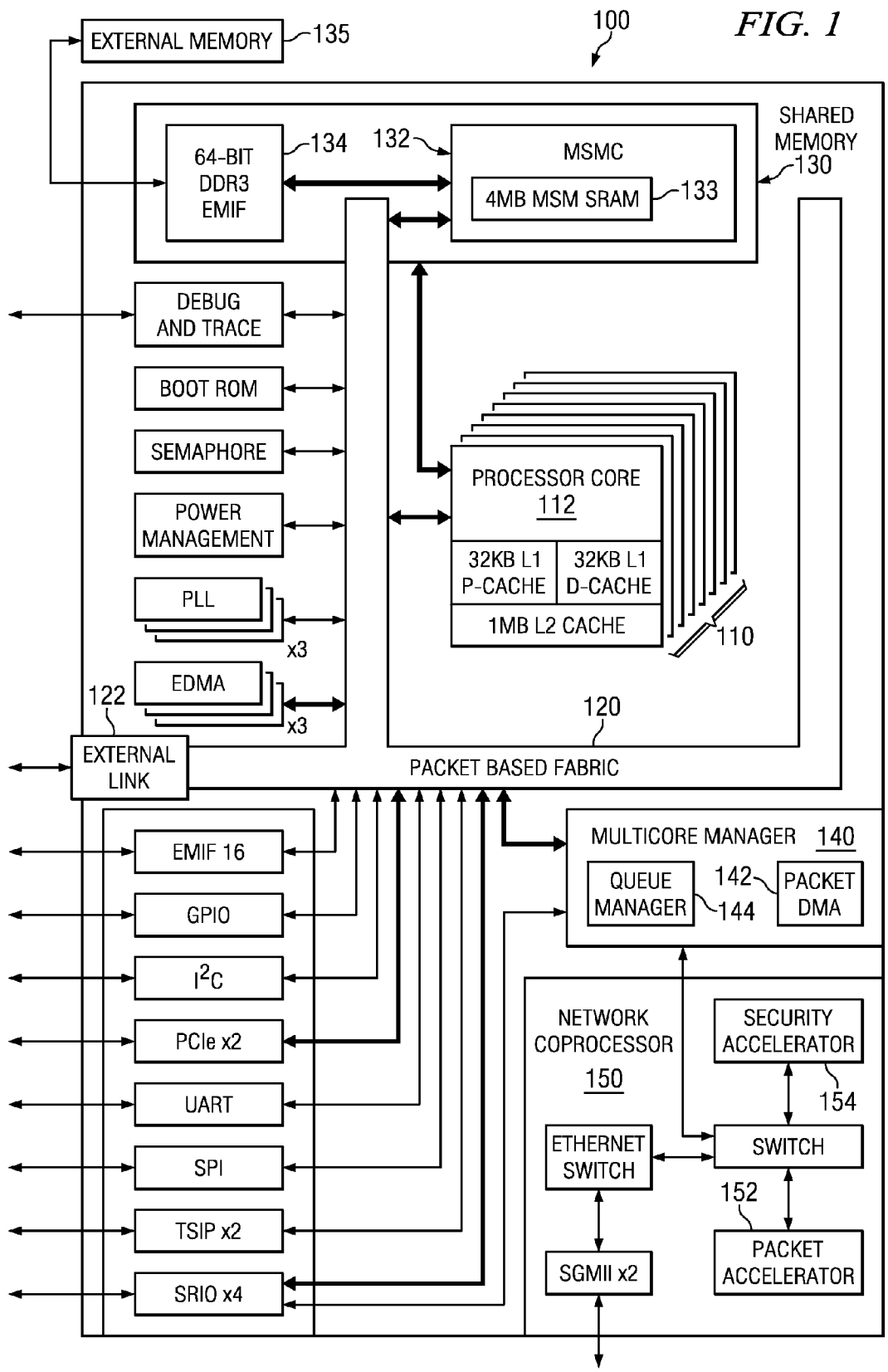
FIG. 1 is a functional block diagram of a system on chip (SoC) that includes an embodiment of the invention.

Other features of the present embodiments will be apparent from the accompanying drawings and from the detailed description that follows.

DETAILED DESCRIPTION OF EMBODIMENTS OF THE INVENTION

Specific embodiments of the invention will now be described in detail with reference to the accompanying figures. Like elements in the various figures are denoted by like reference numerals for consistency. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

High performance computing has taken on even greater importance with the advent of the Internet and cloud computing. To ensure the responsiveness of networks, online processing nodes and storage systems must have extremely robust processing capabilities and exceedingly fast data-throughput rates. Robotics, medical imaging systems, visual inspection systems, electronic test equipment, and high-performance wireless and communication systems, for example, must be able to process an extremely large volume of data with a high degree of precision.

A multi-core architecture that embodies an aspect of the present invention will be described herein. In a typically embodiment, a multi-core system is implemented as a single system on chip (SoC). As used herein, the term "core" refers to a processing module that may contain an instruction processor, such as a digital signal processor (DSP) or other type of microprocessor, along with one or more levels of cache that are tightly coupled to the processor.

A multi-level cache controller within a core module may process different types of transfer requests from multiple requestors that may be targeted to different resources. In a multi-core scenario, these transfers may be divided into two categories: 1) local core central processing unit (CPU) generated, and 2) external master generated. In an embodiment that will be described in more detail below, external master generated transactions that target a local static random access memory (SRAM) within a core module are generated by a direct memory access (DMA) module. The DMA transactions may come from an internal DMA (IDMA) engine, or from a slave DMA (SDMA) interface that is servicing requests from another core CPU module within the SoC. CPU transactions and DMA transactions may both be targeted for a same resource, such as SRAM that may also configured as a level 2 (L2) cache.

In order to improve access and to avoid deadlock situations, embodiments of the present invention may provide distributed arbitration to control access to shared resources by separate pipeline stages for CPU and DMA transactions. These parallel pipelines interact only at the point where they require access to the same shared resource.

As will be explained in more detail below, CPU transaction requests that target an external address are routed so as not to interact with the DMA transactions, and therefore will not effect DMA performance. The cache controller may be configured so that all CPU transactions that target the cache but that miss go out of the cache controller on a separate interface. This interface is also kept separate from the DMA transaction request interface.

In the case where both CPU and DMA transactions interact and require access to a shared memory, a distributed arbitration scheme is provided that tries to maintain a fair bandwidth distribution. For the return data and other acknowledgments back to the requestor, separate return paths may be provided that also participate in distributed arbitration. Thus, each requestor essentially has a separate interface to the shared target resource.

Since any given requestor could potentially block a resource for extended periods of time, a bandwidth management scheme may be implemented in some embodiments to provide fairness for all requestors. The bandwidth management scheme may be summarized as weighted-prioritydriven bandwidth allocation. Each requestor (SDMA, IDMA, CPU, etc) is assigned a priority level on a per-transfer basis. The programmable priority level has a single meaning throughout the system: total of eight priority levels, where priority 0 is highest and priority 7 is lowest priority. When requests for a single resource contend, access is granted to the highest priority requestor. When the contention occurs for multiple successive cycles, a contention counter may guarantee that the lower priority requestor gets access to the resource every 1 out of n cycles, where n is programmable. A priority level of '−1' may used to represent a transfer whose priority has been increased due to expiration of the contention counter.

In an embodiment that will be described in more detail below, arbitration decisions within each core are distributed across four sync points internal to the core. Additional sync points external to the core are also provided. Only the part of the arbitration logic (counters etc.) that apply to a given sync point is used within that sync point. There are options to re-prioritize accesses based on their true criticality. The arbitration decision may get re-evaluated at multiple points, so that a decision which was made in the past can be changed if conditions are different.

In some embodiments, a provision is made to allow an application program that is being executed within the SoC to dynamically control bandwidth allocation to the shared resource. This may be done to optimize different tasks at different times, for example. The priority of requestors may be changed on the fly, and bandwidth problems may be easily fine tuned using the counters. The arbitration is distributed across the resource controllers, which provides flexibility.

Other resources, such as buffers, configuration registers or register files which hold parameters that are required for processing these transactions may be either duplicated or made concurrently readable from multiple sources. Examples of duplicated or concurrently accessible resources include, but are not limited to, the following: a memory protection attributes table, snoop tag status bits register file. This avoids any contention between CPU and DMA.

FIG. 1 is a functional block diagram of a system on chip (SoC) 100 that includes an embodiment of the invention. System 100 is a multi-core SoC that includes a set of processor modules 110 that each include a processor core, level one (L1) data and instruction caches, and a level two (L2) cache. In this embodiment, there are eight processor modules 110; however other embodiments may have fewer or greater number of processor modules. In this embodiment, each processor core is a digital signal processor (DSP); however, in other embodiments other types of processor cores may be used. A packet-based fabric 120 provides high-speed non-blocking channels that deliver as much as 2 terabits per second of on-chip throughput. Fabric 120 interconnects with memory subsystem 130 to provide an extensive two-layer memory structure in which data flows freely and effectively between processor modules 110, as will be described in more detail below. An example of SoC 100 is embodied in an SoC from Texas Instruments, and is described in more detail in "TMS320C6678—Multi-core Fixed and Floating-Point Signal Processor Data Manual", SPRS691, November 2010, which is incorporated by reference herein.

External link 122 provides direct chip-to-chip connectivity for local devices, and is also integral to the internal processing architecture of SoC 100. External link 122 is a fast and efficient interface with low protocol overhead and high throughput, running at an aggregate speed of 50 Gbps (four lanes at 12.5 Gbps each). Working in conjunction with a routing manager 140, link 122 transparently dispatches tasks to other local devices where they are executed as if they were being processed on local resources.

There are three levels of memory in the SoC 100. Each processor module 110 has its own level-1 program (L1P) and level-1 data (L1D) memory. Additionally, each module 110 has a local level-2 unified memory (L2). Each of the local memories can be independently configured as memory-mapped SRAM (static random access memory), cache or a combination of the two.

In addition, SoC 100 includes shared memory 130, comprising internal memory 133 and optional external memory 135 connected through the multi-core shared memory controller (MSMC) 132. MSMC 132 allows processor modules 110 to dynamically share the internal and external memories for both program and data. The MSMC internal RAM offers flexibility to programmers by allowing portions to be configured as shared level-2 RAM (SL2) or shared level-3 RAM (SL3). SL2 RAM is cacheable only within the local L1P and L1D caches, while SL3 is additionally cacheable in the local L2 caches.

External memory may be connected through the same memory controller 132 as the internal shared memory via external memory interface 134, rather than to chip system interconnect as has traditionally been done on embedded processor architectures, providing a fast path for software execution. In this embodiment, external memory may be treated as SL3 memory and therefore cacheable in L1 and L2.

SoC 100 may also include several co-processing accelerators that offload processing tasks from the processor cores in processor modules 110, thereby enabling sustained high application processing rates. SoC 100 may also contain an Ethernet media access controller (EMAC) network coprocessor block 150 that may include a packet accelerator 152 and a security accelerator 154 that work in tandem. The packet accelerator speeds the data flow throughout the core by transferring data to peripheral interfaces such as the Ethernet ports or Serial RapidIO (SRIO) without the involvement of any module 110's DSP processor. The security accelerator provides security processing for a number of popular encryption modes and algorithms, including IPSec, SCTP, SRTP, 3GPP, SSL/TLS and several others.

Multi-core manager 140 provides single-core simplicity to multi-core device SoC 100. Multi-core manager 140 provides hardware-assisted functional acceleration that utilizes a packet-based hardware subsystem. With an extensive series of more than 8,000 queues managed by queue manager 144 and a packet-aware DMA controller 142, it optimizes the packet-based communications of the on-chip cores by practically eliminating all copy operations.

The low latencies and zero interrupts ensured by multi-core manager 140, as well as its transparent operations, enable new and more effective programming models such as task dispatchers. Moreover, software development cycles may be shortened significantly by several features included in multi-core manager 140, such as dynamic software partitioning. Multi-core manager 140 provides "fire and forget" software tasking that may allow repetitive tasks to be defined only once, and thereafter be accessed automatically without additional coding efforts.

Two types of buses exist in SoC 100 as part of packet based switch fabric 120: data buses and configuration buses. Some peripherals have both a data bus and a configuration bus interface, while others only have one type of interface. Furthermore, the bus interface width and speed varies from peripheral to peripheral. Configuration buses are mainly used to access the register space of a peripheral and the data buses are used mainly for data transfers. However, in some cases, the configuration bus is also used to transfer data. Similarly, the data bus can also be used to access the register space of a peripheral. For example, DDR3 memory controller 134 registers are accessed through their data bus interface.

Processor modules 110, the enhanced direct memory access (EDMA) traffic controllers, and the various system peripherals can be classified into two categories: masters and slaves. Masters are capable of initiating read and write transfers in the system and do not rely on the EDMA for their data transfers. Slaves on the other hand rely on the EDMA to perform transfers to and from them. Examples of masters include the EDMA traffic controllers, serial rapid I/O (SRIO), and Ethernet media access controller 150. Examples of slaves include the serial peripheral interface (SPI), universal asynchronous receiver/transmitter (UART), and inter-integrated circuit (I2C) interface.

Figure 2:
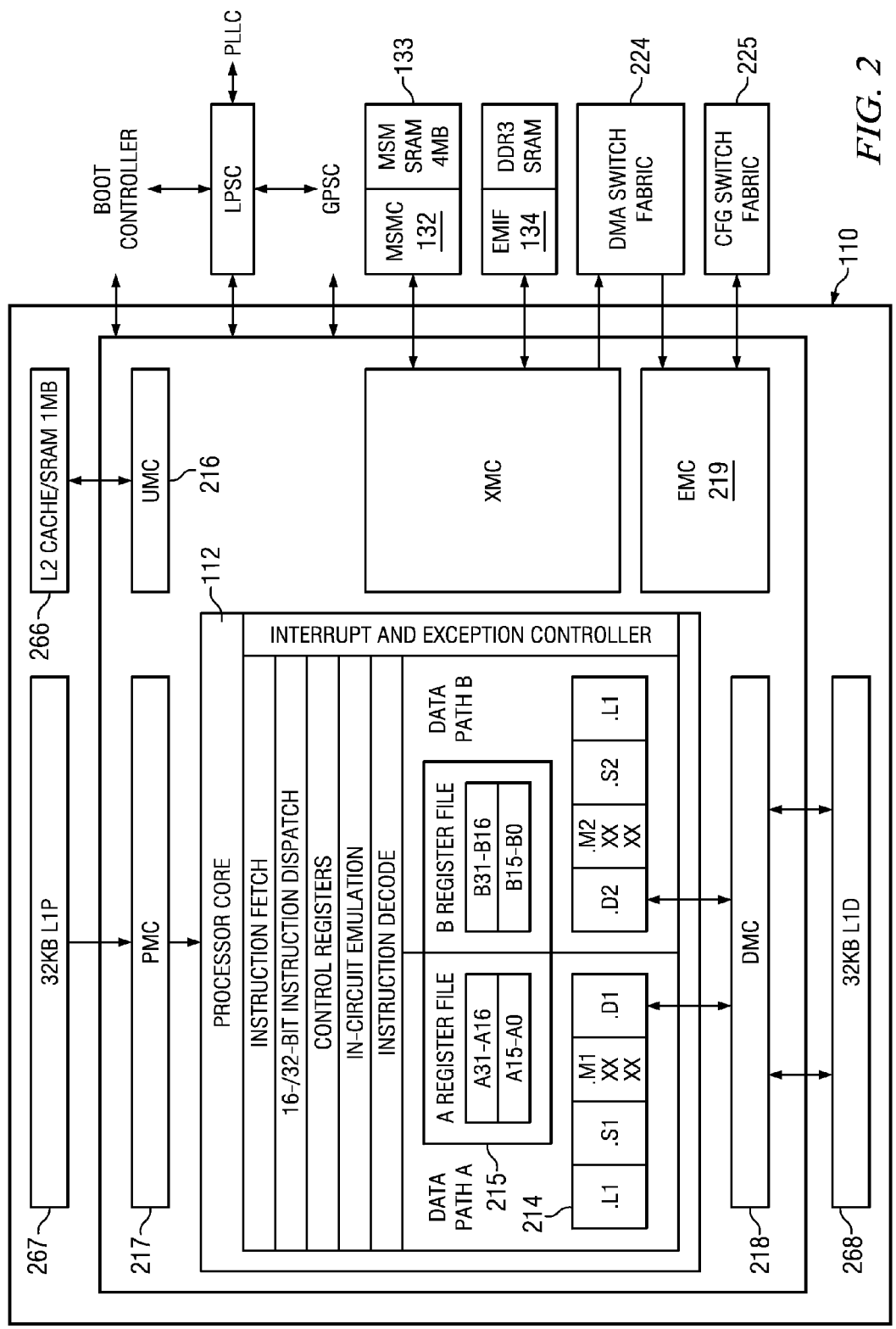
FIG. 2 is a more detailed block diagram of one processing module used in the SoC of FIG. 1.

FIG. 2 is a more detailed block diagram of one processing module 110 used in the SoC of FIG. 1. As mentioned above, SoC 100 contains two switch fabrics that form the packet based fabric 120 through which masters and slaves communicate. A data switch fabric 224, known as the data switched central resource (SCR), is a high-throughput interconnect mainly used to move data across the system. The data SCR is further divided into two smaller SCRs. One connects very high speed masters to slaves via 256-bit data buses running at a DSP/2 frequency. The other connects masters to slaves via 128-bit data buses running at a DSP/3 frequency. Peripherals that match the native bus width of the SCR it is coupled to can connect directly to the data SCR; other peripherals require a bridge.

A configuration switch fabric 225, also known as the configuration switch central resource (SCR), is mainly used to access peripheral registers. The configuration SCR connects the each processor module 110 and masters on the data switch fabric to slaves via 32-bit configuration buses running at a DSP/3 frequency. As with the data SCR, some peripherals require the use of a bridge to interface to the configuration SCR.

Bridges Perform a Variety of Functions:
Conversion between configuration bus and data bus.
Width conversion between peripheral bus width and SCR bus width.
Frequency conversion between peripheral bus frequency and SCR bus frequency.

The priority level of all master peripheral traffic is defined at the boundary of switch fabric 120. User programmable priority registers are present to allow software configuration of the data traffic through the switch fabric. In this embodiment, a lower number means higher priority. For example: PRI=000b=urgent, PRI=111b=low.

All other masters provide their priority directly and do not need a default priority setting. Examples include the processor module 110, whose priorities are set through software in a unified memory controller (UMC) 216 control registers. All the Packet DMA based peripherals also have internal registers to define the priority level of their initiated transactions.

DSP processor core 112 includes eight functional units 214, two register files 215, and two data paths. The two general-purpose register files 215 (A and B) each contain 32 32-bit registers for a total of 64 registers. The general-purpose registers can be used for data or can be data address pointers. The data types supported include packed 8-bit data, packed 16-bit data, 32-bit data, 40-bit data, and 64-bit data. Multiplies also support 128-bit data. 40-bit-long or 64-bit-long values are support in register pairs, with the 32 LSBs of data placed in an even register and the remaining 8 or 32 MSBs in the next upper register (which is always an odd-numbered register). 128-bit data values are stored in register quadruplets, with the 32 LSBs of data placed in a register that is a multiple of 4 and the remaining 96 MSBs in the next 3 upper registers.

The eight functional units 214 (.M1, .L1, .D1, .S1, .M2, .L2, .D2, and .S2) are each capable of executing one instruction every clock cycle. The .M functional units perform all multiply operations. The .S and .L units perform a general set of arithmetic, logical, and branch functions. The .D units primarily load data from memory to the register file and store results from the register file into memory. Each .M unit can perform one of the following fixed-point operations each clock cycle: four 32×32 bit multiplies, sixteen 16×16 bit multiplies, four 16×32 bit multiplies, four 8×8 bit multiplies, four 8×8 bit multiplies with add operations, and four 16×16 multiplies with add/subtract capabilities. There is also support for Galois field multiplication for 8-bit and 32-bit data. Many communications algorithms such as FFTs and modems require complex multiplication. Each .M unit can perform one 16×16 bit complex multiply with or without rounding capabilities, two 16×16 bit complex multiplies with rounding capability, and a 32×32 bit complex multiply with rounding capability. The .M unit can also perform two 16×16 bit and one 32×32 bit complex multiply instructions that multiply a complex number with a complex conjugate of another number with rounding capability.

Communication signal processing also requires an extensive use of matrix operations. Each .M unit is capable of multiplying a [1×2] complex vector by a [2×2] complex matrix per cycle with or without rounding capability. A version also exists allowing multiplication of the conjugate of a [1×2] vector with a [2×2] complex matrix. Each .M unit also includes IEEE floating-point multiplication operations, which includes one single-precision multiply each cycle and one double-precision multiply every 4 cycles. There is also a mixed-precision multiply that allows multiplication of a single-precision value by a double-precision value and an operation allowing multiplication of two single-precision numbers resulting in a double-precision number. Each .M unit can also perform one the following floating-point operations each clock cycle: one, two, or four single-precision multiplies or a complex single-precision multiply.

The .L and .S units support up to 64-bit operands. This allows for arithmetic, logical, and data packing instructions to allow parallel operations per cycle.

An MFENCE instruction is provided that will create a processor stall until the completion of all the processor-triggered memory transactions, including:
Cache line fills
Writes from L1D to L2 or from the processor module to MSMC and/or other system endpoints
Victim write backs
Block or global coherence operation
Cache mode changes
Outstanding XMC prefetch requests.

The MFENCE instruction is useful as a simple mechanism for programs to wait for these requests to reach their endpoint. It also provides ordering guarantees for writes arriving at a single endpoint via multiple paths, multiprocessor algorithms that depend on ordering, and manual coherence operations.

Figure 3:
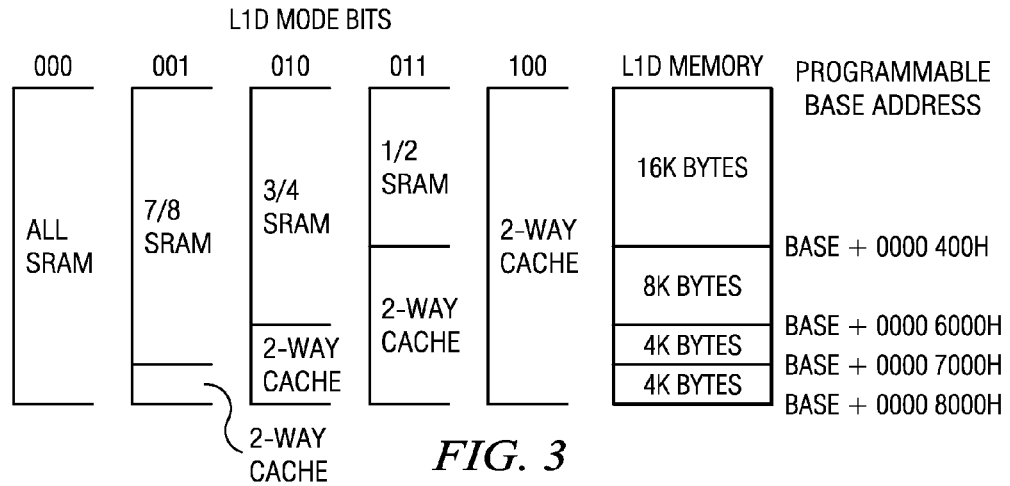
FIGS. 3 and 4 illustrate configuration of the L1 and L2 caches.

Each processor module 110 in this embodiment contains a 1024 KB level-2 memory (L2) 216, a 32 KB level-1 program memory (L1P) 217, and a 32 KB level-1 data memory (L1D) 218. The device also contains a 4096 KB multi-core shared memory (MSM) 132. All memory in SoC 100 has a unique location in the memory map The L1P and L1D cache can be reconfigured via software through the L1PMODE field of the L1P Configuration Register (L1PCFG) and the L1DMODE field of the L1D Configuration Register (L1DCFG) of each processor module 110 to be all SRAM, all cache memory, or various combinations as illustrated in FIG. 3, which illustrates an L1D configuration; L1P configuration is similar. L1D is a two-way set-associative cache, while L1P is a direct-mapped cache.

Figure 4:
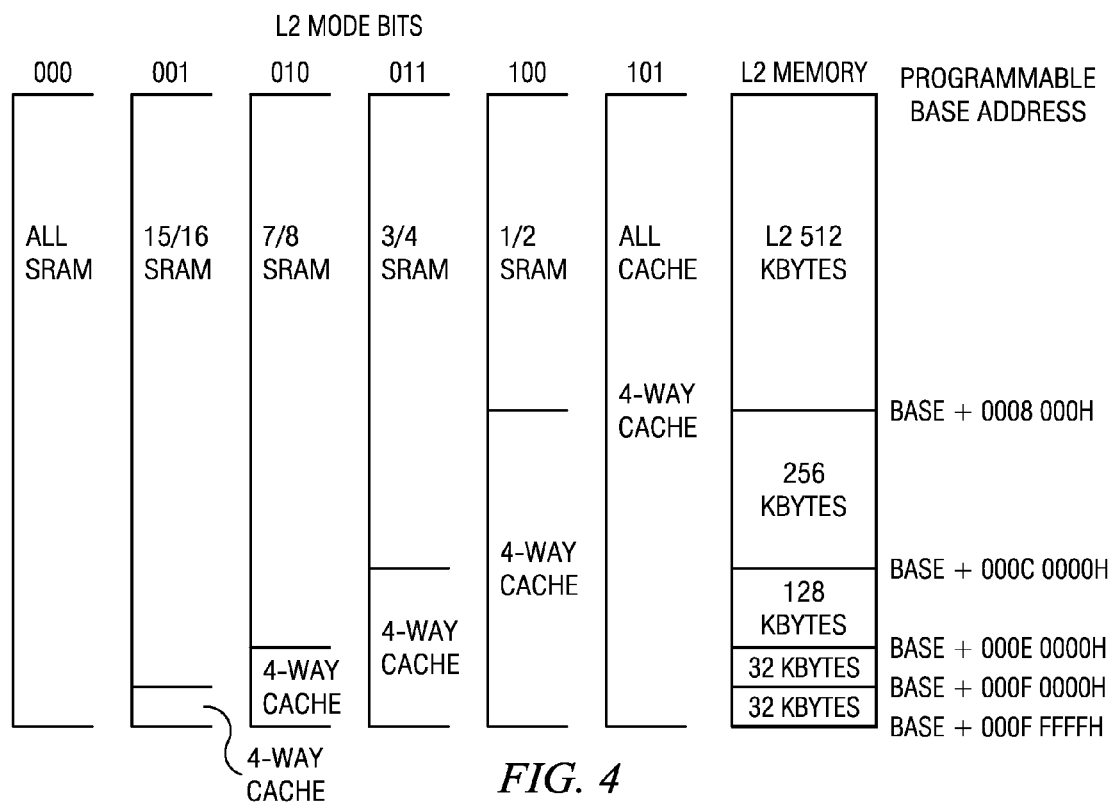

L2 memory can be configured as all SRAM, all 4-way set-associative cache, or a mix of the two, as illustrated in FIG. 4. The amount of L2 memory that is configured as cache is controlled through the L2MODE field of the L2 Configuration Register (L2CFG) of each processor module 110.

Global addresses are accessible to all masters in the system. In addition, local memory can be accessed directly by the associated processor through aliased addresses, where the eight MSBs are masked to zero. The aliasing is handled within each processor module 110 and allows for common code to be run unmodified on multiple cores. For example, address location 0x10800000 is the global base address for processor module 0's L2 memory. DSP Core 0 can access this location by either using 0x10800000 or 0x00800000. Any other master in SoC 100 must use 0x10800000 only. Conversely, 0x00800000 can by used by any of the cores as their own L2 base addresses.

Level 1 program (L1P) memory controller (PMC) 217 controls program cache memory 267 and includes memory protection and bandwidth management. Level 1 data (L1D) memory controller (DMC) 218 controls data cache memory 268 and includes memory protection and bandwidth management. Level 2 (L2) memory controller, unified memory controller (UMC) 216 controls L2 cache memory 266 and includes memory protection and bandwidth management. External memory controller (EMC) 219 includes Internal DMA (IDMA) and a slave DMA (SDMA) interface that is coupled to data switch fabric 224. The EMC is coupled to configuration switch fabric 225. Extended memory controller (XMC) is coupled to MSMC 132 and to dual data rate 3 (DDR3) external memory controller 134. The XMC provides a lookahead prefetch engine for L2 cache 216/266.

Figure 5:
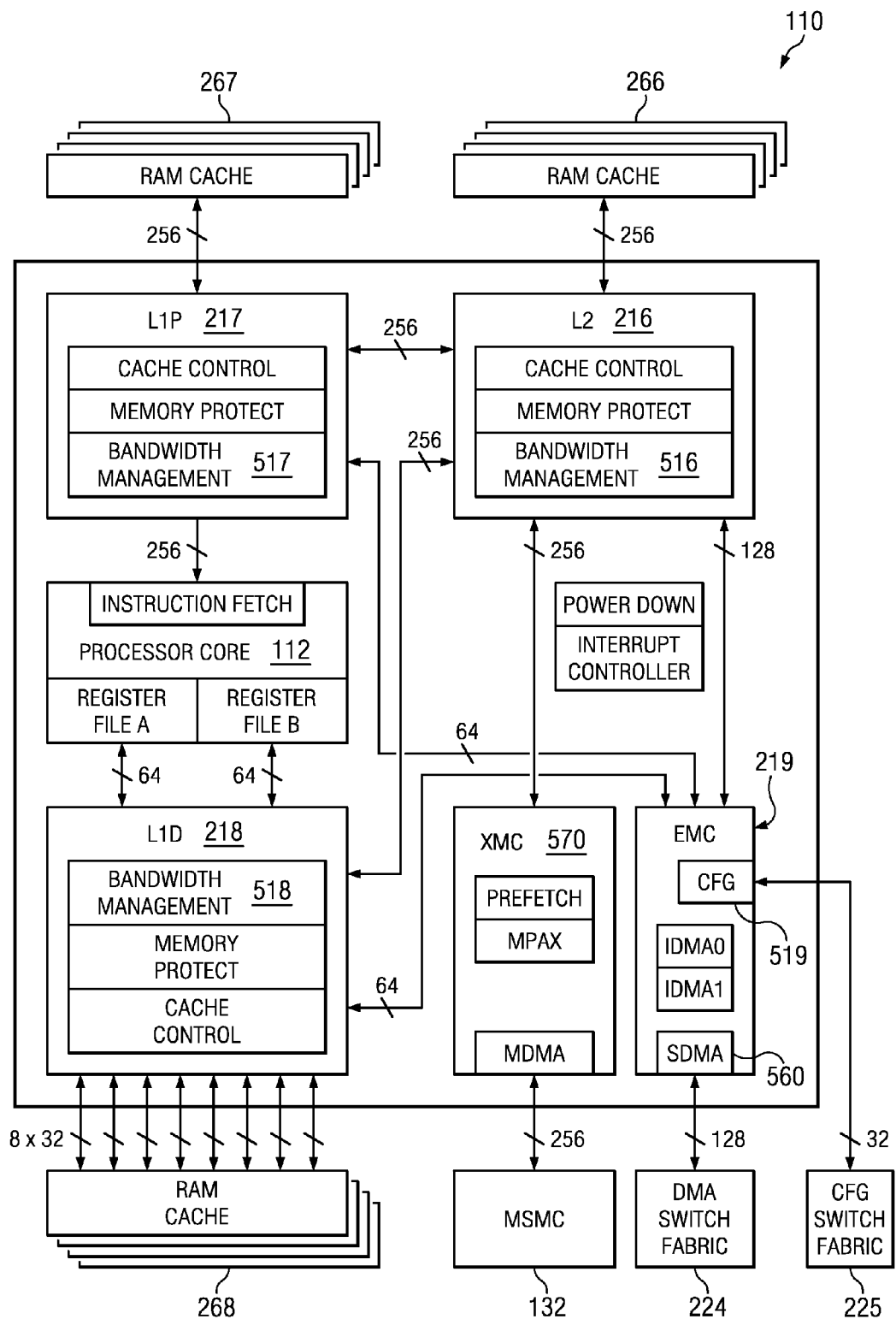
FIG. 5 is a more detailed block diagram of one processing module used in the SoC of FIG. 1.

FIG. 5 is a more detailed block diagram of one processing module 110 used in the SoC of FIG. 1 that illustrates distributed bandwidth management. When multiple requestors contend for a single processor module 110 resource, the conflict is resolved by granting access to the highest priority requestor. The following four resources are managed by the bandwidth management control hardware 516-519:
  Level 1 Program (L1P) SRAM/Cache 217
  Level 1 Data (L1D) SRAM/Cache 218
  Level 2 (L2) SRAM/Cache 216
  EMC 219

The priority level for operations initiated within the processor module 110 are declared through registers within each processor module 110. These operations are:
  DSP-initiated transfers
  User-programmed cache coherency operations
  IDMA-initiated transfers The priority level for operations initiated outside the processor modules 110 by system peripherals is declared through the Priority Allocation Register (PRI_ALLOC). System peripherals that are not associated with a field in PRI_ALLOC may have their own registers to program their priorities.
Distributed Arbitration As described above, each core module 110 must control the dataflow between its internal resources, including L2 SRAM/Cache, L1P SRAM/Cache, L1D SRAM/Cache; MMR (memory mapped register) Configuration Bus, and each of the potential requestors, which include external DMA initiated transfers received at the slave DMA (SDMA) interface, internal DMA (IDMA) initiated transfers, internal cache coherency operations, and CPU direct initiated transfers, which include: L1D initiated transfers such as load/store, and L1P initiated transfers such as program fetch.

Figure 6:
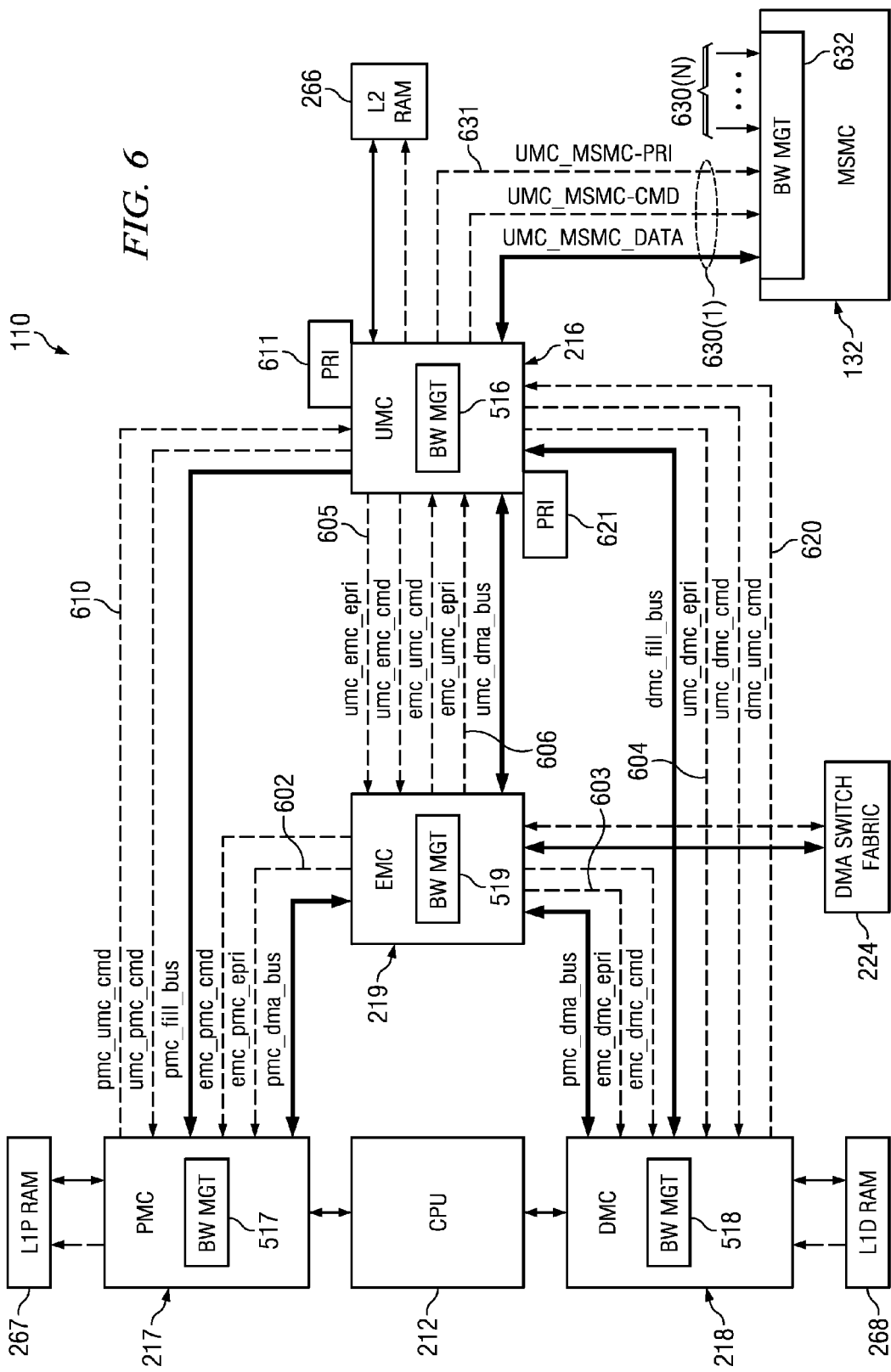
FIG. 6 is a block diagram illustrating a portion of the processing module of FIG. 5 in more detail.

FIG. 6 is a block diagram illustrating a portion of a processing module 110 in more detail. As illustrated in FIG. 5, there are various buses that interconnect UMC 216, PMC 217, DMC 218 and EMC 219. Each of these buses includes signal lines for a command portion and data portion of each transaction packet. Most of the buses also include signal lines to carry the priority value associated with each transaction command, such as: EMC to PMC priority signal 602; EMC to DMC priority signal 603, UMC to DMC priority signal 604; UMC to EMC priority signal 605; and EMC to UMC priority signal 606.

FIG. 7 illustrates one of a set of programmable priority value registers 700 used in SoC 100. Most requesters in SoC 100 have a copy of memory mapped programmable priority register similar to register 700 associated with them. Priority field 702 is a three-bit field that is used to specify a priority value of 0-7, where a value of 0 indicates highest priority and a value of 7 indicates lowest priority. Maxwait field 704 defines a maximum number of arbitration contests that requester may lose before its priority value is elevated for one arbitration contest.

Referring again to FIG. 6, priority for PMC-UMC commands 610 and DMC to UMC commands 620 are each specified by priority registers 611, 621 that are similar to register 700, therefore a priority signal is not needed in the bus for those commands. As will be explained in more detail below, requests initiated by CPU 212 to program cache 217 and data cache 218 will cause transaction request commands 610, 620 when a respective cache miss occurs. UMC 216 will arbitrate between competing requests based on the priority value stored in the associated priority register 610, 620 using arbitration logic within bandwidth management logic 516. The winning request is then granted access to L2 cache RAM 266 if the requested data is present in L2 cache 266, as indicated by tags in UMC 216. The general operation of caches is known and does not need to be explained in further detail here.

If the requested data is not present in L2 cache 266, then another access request is generated and may be sent to shared L3 memory coupled to MSMC 132 via bus link 630(1), sent to off-chip memory 135, or be sent to any other memory on-chip using the global address capability. This request goes through XMC 570 for routing, as illustrated in FIG. 5. Each of the other core modules 110 also send request commands to MSMC 132 via individual bus links 630(N). Arbitration logic within bandwidth management logic 632 uses a priority value for each request command sent on a priority signal with the request command, such as priority signal 631 that is part of link 630(1). However, as will be described in more detail below, the priority value that is provided on signal 631 may indicate an elevated priority if the winner of the arbitration contest in UMC 216 had to have its priority elevated in order to win the arbitration contest. In this manner, a requester that contends for access and has to wait until its assigned priority value is elevated in order to win an arbitration contest maintains its elevated priority when a cache miss, for example, forces it to contend in another arbitration contest.

Figure 8:
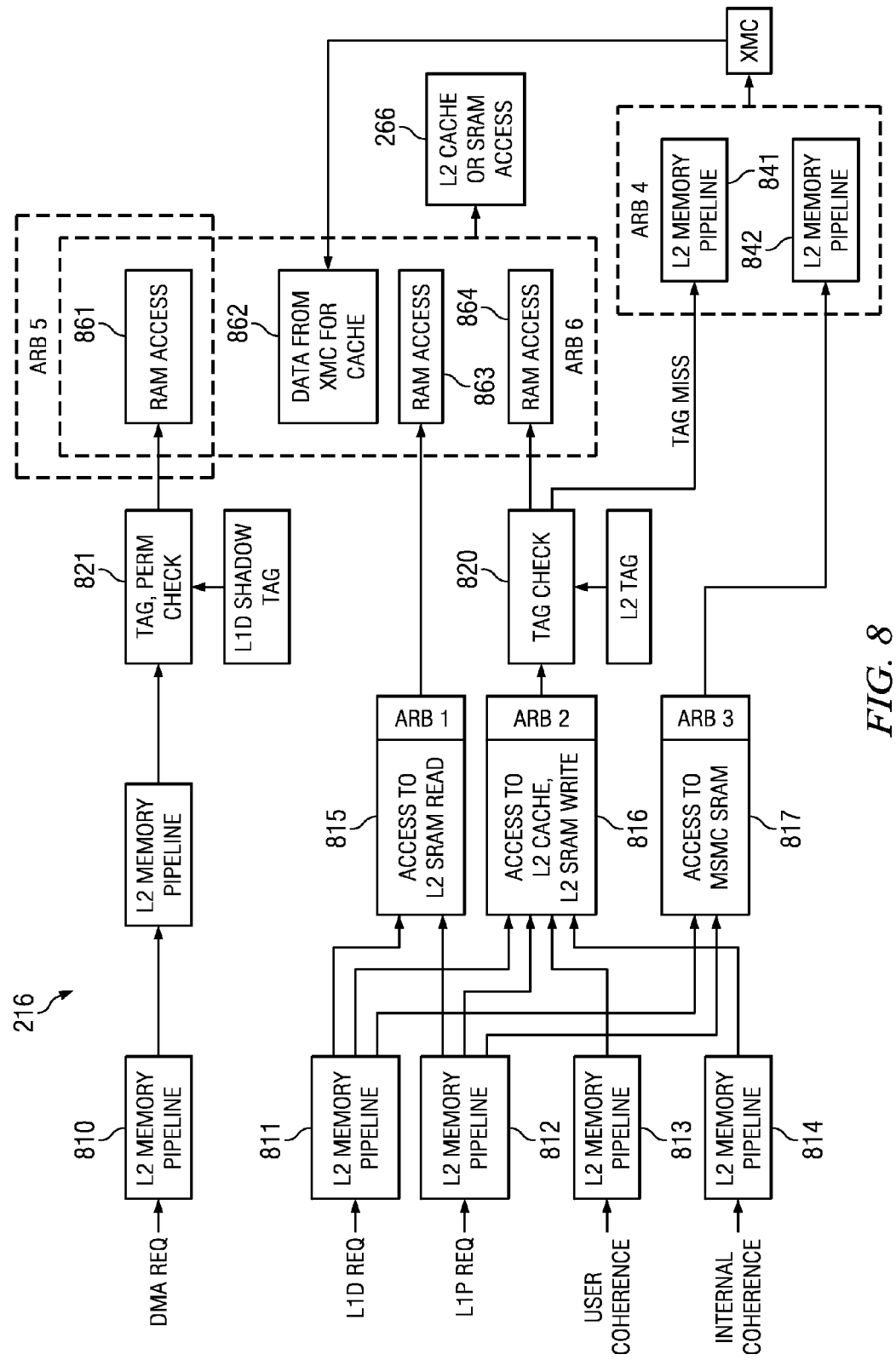
FIG. 8 is a block diagram illustrating distributed arbitration within the unified memory controller of FIG. 5.

FIG. 8 is a block diagram illustrating distributed arbitration within unified memory controller (UMC) 216 in more detail. In order to improve access to shared resources and to avoid deadlock situations, separate pipelines may be provided in each UMC for CPU and DMA transactions. These parallel pipelines interact only at the point where they require access to the same shared resource. In the case where both CPU and DMA transactions interact and require access to a shared memory, an arbitration scheme is provided that tries to maintain a fair bandwidth distribution. For the return data and other acknowledgments back to the requestor, separate return paths are provided. Thus, each requestor essentially has a separate interface to the shared target resource.

Referring again to FIG. 5, slave DMA interface 560 receives transaction requests from external masters via the data switch fabric 224. Referring back to FIG. 1, these requests may be originated by another processor module 110, by packet DMA 142 or from a master that is external to the SoC via external link 122, for example. As explained above, L1P memory 267, L1D memory 268 and L2 memory 266 may each be configured as a cache, a shared memory or a combination. The address space of each memory is also mapped into the SoC global address space, therefore, transaction requests from masters external to processor module 110 may access any of these memory resources within processor module 110.

Referring again to FIG. 8, CPU transaction requests that target an external address are routed via MSMC pipeline 817 so as not to interact with the DMA transactions, and therefore will not effect DMA performance. The cache controllers are configured so that all CPU transactions that target the cache but that miss go out of the cache controller on a separate interface. This interface is also kept separate from the DMA transaction request interface.

L2 transaction request pipeline stage 811 receives transaction requests from L1D cache controller 218 when a miss occurs in the L1D cache and for data write back. L2 transaction request pipeline stage 812 receives transaction requests from L1P cache controller 217 when a miss occurs in the L1P cache. L2 transaction request pipeline stage 813 receives transaction requests from user coherence transactions. These are generally in response to an internally generated block writeback and/or invalidate mechanism. CPU initiates it by writing to a memory mapped register. That initiates writeback with or with out invalidate of a block of memory in any of the caches. This operations may create victims if the cached line is modified, or may just mark it 'clean' or 'invalid' L2 transaction request pipeline stage 814 receives transaction requests from internal coherence requests resulting from cache mode changes, resets, etc.

After pipeline stage 812 receives a transaction access request from L1P cache controller 217, the request is routed to SRAM access stage 815 if the request is to read SRAM 266, otherwise the request is routed to L2 cache access stage 816 when the request is to access the L2 cache. Similarly, after pipeline stage 811 receives a transaction access request from L1D cache controller 218, the request is routed to SRAM access stage 815 if the request is to read SRAM 266, otherwise the request is routed to L2 cache access stage 816 when the request is to write to SRAM 266 or to access the L2 cache. Coherence requests received in pipeline stages 813, 814, are also routed to L2 cache stage 816. After an arbitration contest by arbitration logic ARB1, SRAM read requests are then forwarded to access stage 863.

For write requests and cache access requests, after an arbitration contest by arbitration logic ARB2, permission check stage 820 then accesses L2 tags to determine if the requested data item is currently within shared resource 266 and if the application being executed on the local processor has permission to access the data item. The general operation of caches and the use of tags to indicate access permission and to indicate if a particular data item is currently in cache memory is well known and need not be described in detail herein. An L2 pipeline stage may provide buffering while the tags are checked. If the data item is present, then the transaction request proceeds to L2 pipeline access stage 864. However, if the requested data item is not present in L2 memory 266, then a transaction request is sent to access stage 841 that sends a request to extended memory controller 570 for access to level 3 memory subsystem 130 (see FIG. 1). While a request to extended memory system 130 is in progress, pipeline 816 may stall and wait for a response from extended memory subsystem 130. In this embodiment, pipeline portions 841, 842 include deep buffering that allows multiple such requests pending for memory system 130 before the L2 pipeline portions 815, 820 need to stall. This allows the pipeline to keep flowing in many cases while access to memory system 130 occurs. When the results are returned from extended memory system 130, the requested data and status results of the access are provided to L2 pipeline stage 862 to return to L1P cache controller 217 or to L1D cache controller 218 and the pipeline stall is removed. Arbitration may then be repeated to update the shared resource 266 with the results returned from memory system 130.

When the requested data item is present in shared resource 266, pipeline stage 864 then arbitrates for access to shared resource 266. When the arbitration process grants access to shared memory 266, the requested data and status results of the access are returned to L1P cache controller 217 or L1D cache controller 218.

When a request from L1P in pipeline stage 812 or a request from L1D in pipeline stage 811 that is for an address in memory system 130, that request is routed to pipeline stage 817. After an arbitration contest by arbitration logic ARB3, a request is sent to access stage 842 without involving tag check stage 820. After an arbitration contest by arbitration logic ARB4, a request is then sent directly to memory system 130.

L2 pipeline stage 810 may receive a transaction access request from slave DMA module 560 when an external master is requesting access to shared resource 266 via DMA switch fabric 224. Pipeline stage 810 may also receive transaction requests from internal DMA modules IDMA0 and IDMA1 that are located in EMC 219 internal to processor module 110. Pipeline stage 821 may access L1D shadow tags to determine if the requested data item is currently within L1D cache 218-268 in order to determine if the L1D cache and L2 SRAM 266 are coherent. L2 pipeline stage 821 may provide buffering while the tags are checked. If permission is granted, then the transaction request proceeds to L2 pipeline stage 861 to arbitrate for access to shared resource 266. When the arbitration process grants access to shared memory 266, the requested data and status results of the access are provided to return to DMA module 560 and thereby to the external master that requested the transaction.

In this manner, a DMA transaction requests is not stalled behind a CPU transaction request from the L1P cache controller or from the L1D cache controller. These DMA transactions may be generated by an external master that does not have visibility into the traffic generated by the local CPU and in many cases, these DMA transactions are time sensitive and are required to complete in a fixed amount of time. By using a parallel pipeline, DMA transactions will not stall behind CPU transactions that stall waiting on data from L3 memory. Therefore, data corruption and data drops in the external master are avoided. Furthermore, deadlocks that might otherwise occur in some cases in which a stalled CPU transaction may be directly or indirectly dependent on the DMA transactions, since the parallel pipeline DMA bypasses stalled CPU requests to shared memory 266.

The L2 Tags and L1D shadow tags may be implemented as duplicate tag sets in order to eliminate access conflicts by pipeline stages 820, 821. The number of stages in each pipeline is determined by the timing requirements of processor module 110. The general idea of pipeline processing with multiple stages is well known and does not need to be described in detail herein.

Distributed Arbitration Logic Details

As described in some detail above, SoC 100 includes multiple cores that access shared resources, both local to each core and globally within SoC 100. Multiple access pipelines and switching fabrics are provided to improve performance. Distributed arbitration logic allows these parallel pipelines to interact only at the point where they require access to the same memory resource.

Referring still to FIG. 8, arbitration logic ARB 1 in stage 815 arbitrates between L1P and L1D accesses to L2 SRAM. In this embodiment, this is a fixed arbitration and L1D always wins over L1P.

Arbitration logic ARB 2 in stage 816 arbitrates between four types of accesses: L1P read to L2 CACHE from stage 811; L1D read to L2CACHE, L1D write to L2 CACHE, L1D write to L2 SRAM from stage 812; User Coherence (UC) (block writeback, global writeback) from stage 813; and Internal Coherence (IC) (reset, cache mode change etc.) from stage 814. In this embodiment, arbitration logic ARB 2 implements both fixed and fair share arbitration. Access requests for global writeback and internal coherence always win. Fair share arbitration is implemented between two sets of access: set #1—L1P, L1D; set #2—block coherence. Fair share arbitration uses priorities and maxwait counters, as will be described in more detail with regard to FIG. 9. In this embodiment, priority for block coherence is set to 7 (lowest) and priority for L1P, L1D is programmable (0 thru 7), using a priority register CPUARB.PRI that is similar to register 700 in FIG. 7. Bandwidth counters determine who will win: CPUARB.MAXWAIT for set #1 and UARB.MAXWAIT for set #2.

Arbitration logic ARB 3 in stage 817 arbitrates for access to MSMC SRAM. In this embodiment, this is a fixed Arbitration; L1D always wins over L1P.

Arbitration logic ARB 4 provides arbitration between stage 841 and stage 842 for access to XMC. In this embodiment, this is a fixed arbitration; L2 CACHE misses from stage 841 always win over L1D, L1P MSMC SRAM accesses from stage 842.

Arbitration logic ARB 5 provides a form of arbitration for DMA requests. DMA's are of two types, and each has its own expectation of fairness. Each DMA request includes that information, and points to the type of DMA: SDMA (Slave DMA), and IDMA (Internal DMA). As such, ARB 5 is not really an arbitration point; it is more of a multiplex point to pick the right bandwidth program values for the current pending DMA access. Priority for each DMA command is part of the command information. Arbitration logic ARB 5 picks from either of SDMAARB.MAXWAIT or IDMAARB.MAXWAIT values for fairness arbitration that are programmable using registers similar to register 700.

Arbitration logic ARB 6 provides arbitration between access in stages 861-864 for access to SRAM 266 for either an L2 SRAM, or L2 CACHE access. In this embodiment, a combination of fixed and fair share arbitration is provided. Read data from XMC that is being returned from memory system 130 always wins access to write to the cache. Fair share is provided between two sets: set #1—L1P; set #2—L1D and DMA, using priority and maxwait counters. Read data from XMC (Allocate data) is inherently assigned a priority value of −2. This makes it the highest priority. Victim caused as a result of allocate for coherence is inherently assigned a priority value of −1. L1D, L1P priority comes with the L1D, L1P command (0 thru 7). DMA Priority comes with the DMA command (0 thru 7).

For each arbitration contest in arbitration logic ARB 6 priority −2 wins over Priority −1, which in turn wins over the rest. For DMA & L1P, L1D; if priorities are equal, each gets 50% bandwidth. If priorities are unequal, the one with higher priority wins (0-7, 7 is lowest). The losing access will get a chance to win when its counter times out.

Figure 9:
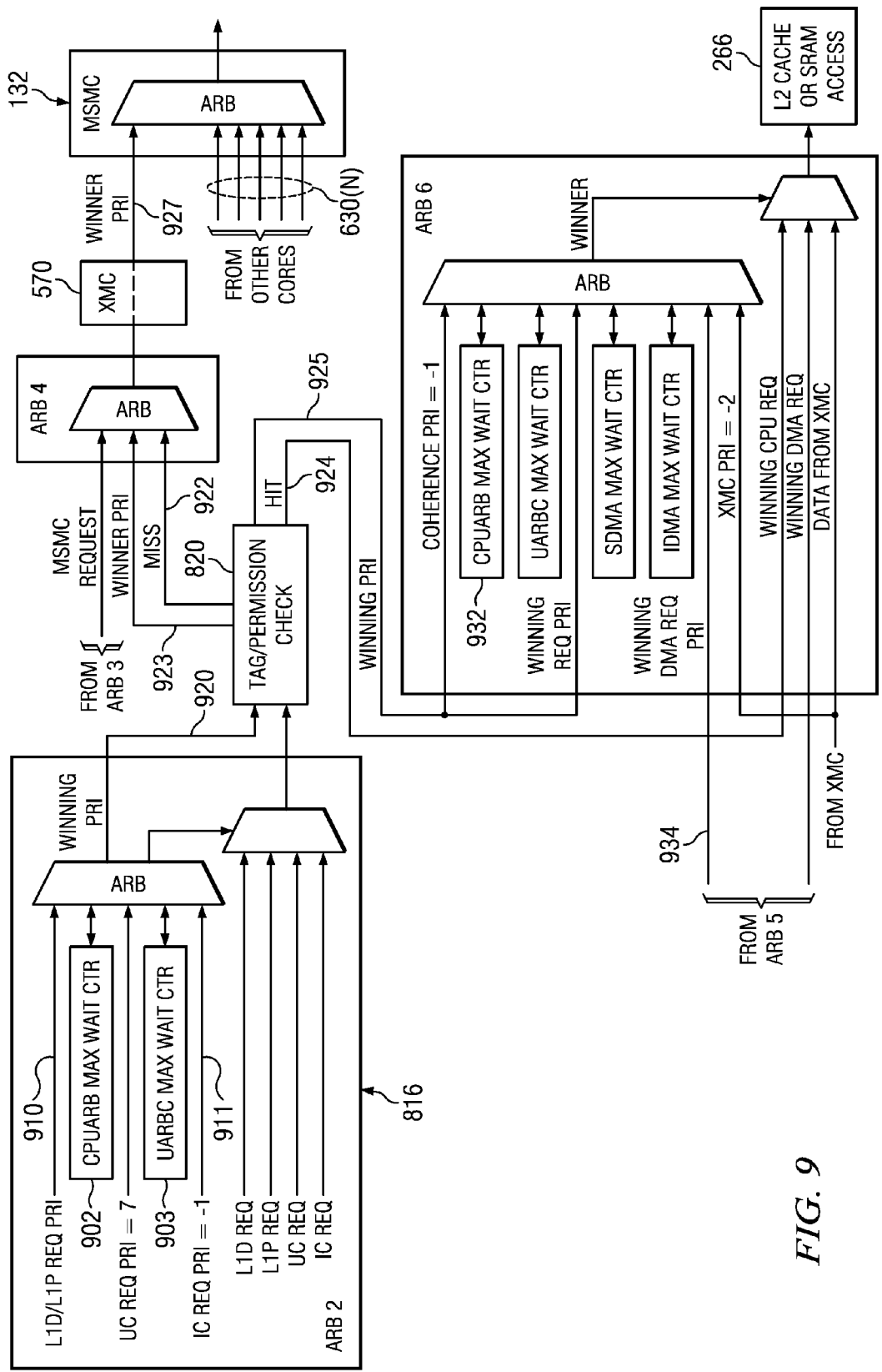
FIG. 9 is a schematic illustrating aspects of distributed arbitration in the SoC of FIG. 1.

FIG. 9 is a schematic illustrating aspects of distributed arbitration in SoC 100 of FIG. 1. As mentioned earlier, this embodiment also includes arbitration fairness logic that monitors the arbitration process to assure that each pipeline receives a fair portion of the access bandwidth of the shared resource. Fairness logic may use a weighting scheme to allocate a portion of the bandwidth to each pipeline. One or more registers coupled to an arbitration point that are accessible to a program being executed within SoC 100 may be dynamically updated by the program to change the weighting values in order to optimize operation of the SoC. For example, in a real-time critical application, the fairness logic for arbitration logic ARB 6, as shown in FIG. 8, may be weighted to provide a high percentage of access bandwidth to the DMA requests. In a computational intensive application, the fairness logic may be weighted to provide a high percentage of access bandwidth to the CPU accesses. In a multi-core SoC, various processing modules 110 may have different fairness weighting for the shared resource access within each respective processor module.

Referring to FIG. 9, arbitration fairness is implemented using maximum wait counters, such as CPU max wait counter 902 and user coherence max wait counter 903, for example. During each arbitration contest, the counter of the loser is incremented. Once a counter reaches the maximum wait value, the priority of the associated requester is elevated to assure that it wins the next arbitration contest. The maximum wait value may be dynamically defined using a priority register for each requested similar to register 700. In this manner, a lower priority requester is not starved when competing against a higher priority requester for access to a shared resource.

Another aspect of distributed arbitration allows an elevated priority value from one arbitration point to be propagated to another arbitration point so that a lower priority requester is not penalized repeatedly at subsequent arbitration points. For example, in pipeline stage 816 with arbitration logic ARB 2, if L1D/L1P priority is set to three, then CPU access requests 910 competing against a block of internal coherence requests 911 that have an inherent priority value of −1 will always loose until CPU max wait counter 902 reaches the programmed maximum wait value. For example, if the CPU maximum wait value is four, then every four cycles CPU request 910 will win and be allowed to proceed to tag check stage 820.

When access request 910 to L2 cache hits, then the request is forwarded 924 to sub-arbitration point ARB 6 where another arbitration competition is performed against DMA access requests 934. If the DMA request has a higher priority, then the CPU request may again be blocked until another CPU maximum wait counter 932 counts to four, which is the currently programmed CPU maximum wait value. However, in this embodiment, since CPU request 910 was blocked until its priority was elevated by max wait counter 902, this elevated priority value 925 is included with forwarded request 924 and used in the arbitration contest performed by arbitration logic ARB 6. In this manner, since request 902 had to wait for a full max wait period, forwarded request 924 will not be further delayed. For example, if max wait counter 902 caused the priority of request 910 to be elevated to a value of −1, then forwarded request 924 while include a priority value 925 equal to −1 which guarantees it immediate access to shared resource 266, unless an XMC returned data request with an implied priority value of −2 is pending.

Similarly, when access request 910 to L2 cache misses, then the request is forwarded 922 to sub-arbitration point ARB 4 where another arbitration competition is performed against other MSMC requests from pipeline stage 817. Priority value 923 reflects the prior winning priority value. In this example, since request 910 experienced max wait and was elevated to a priority value of −1, the forwarded priority value 923 will be −1. In this manner, forwarded request 923 will immediately win arbitration ARB 4 and be forwarded to another arbitration contest in MSMC 132. MSMC arbitrates between requests from all of the cores 110. In this example, forwarded priority value 927 will be −1, so miss request 922 is guaranteed minimal wait access to memory system 130 controlled by MSMC 132.

In other embodiments, the elevated priority value may be restricted somewhat. Max wait counters and sub-arbitration points may be programmed with different values to provide scaled maximum wait counts, for example.

In another embodiment, priority elevation may not be provided at all, for example. In this case, the forwarded priority has the same value as the initial request.

FIG. 10 is a flow diagram illustrating operation of distributed arbitration for access to shared resources in a system that has multiple requesters and multiple shared resources. A separate arbitration point is provided 1002 for each of the multiple shared target resources. As described above, the arbitration points may operate in a fixed manner, or provide fair sharing for bandwidth management using counters or other management schemes now known or later developed.

Each of the multiple requesters are assigned 1004 a priority value. As described above, this may be a fixed value, an inherent or implied value, are a dynamically variable value controlled by software being executed on the system, for example.

The system may be interconnected in a hierarchical manner, such that when a request is made to a first target resource, the request may need to be forwarded to one or more subsequent target resources to correctly satisfy the request. For example, an arbitration contest 1006 may be performed at a first arbitration point to resolve requests from two or more requesters for access to a first shared target resource using arbitration logic that is provided for the first target resource. The winning requester is then granted access 1008 to the first shared resource. If the first shared resource is a set of tags controlling a cache, for example, and if the cache does not hold the requested data item, the request must be forwarded 1010 to a next higher level in the memory hierarchy.

At the next level in the hierarchy, another arbitration contest 1012 may be performed between the forwarded request and one or more of the multiple requesters using a second arbitration point associated with the second target resource. The winning requester is then granted access 1014 to the shared resource.

In some embodiments, at one or more arbitration points, a bandwidth management scheme may be used to elevate 1020 the priority of the request from requester during the arbitration contest 1006 at the first arbitration point to allow the requester to win the arbitration contest. The elevated priority of the request from the winning requester may be forwarded 1008 along with the forwarded request to be used while contending for access to the second target resource.

As described in more detail above, one scheme for managing bandwidth 1020 is to provide a contention counter at the first arbitration point for at least one of the requesters having a lower priority. A sequence of arbitration contests 1006 is performed at the first arbitration point for requests from the plurality of requesters for access to the first target resource. Access is granted 1008 to the first target resource to the winning requestor of each arbitration contest. The contention counter is incremented (or decremented) each time the lower priority requester loses an arbitration contest in a sequence of arbitration contests. The priority of the lower priority requester is elevated when the contention counter reaches a value N, such that the lower priority requester will win the next arbitration contest.

System Example

Figure 11:
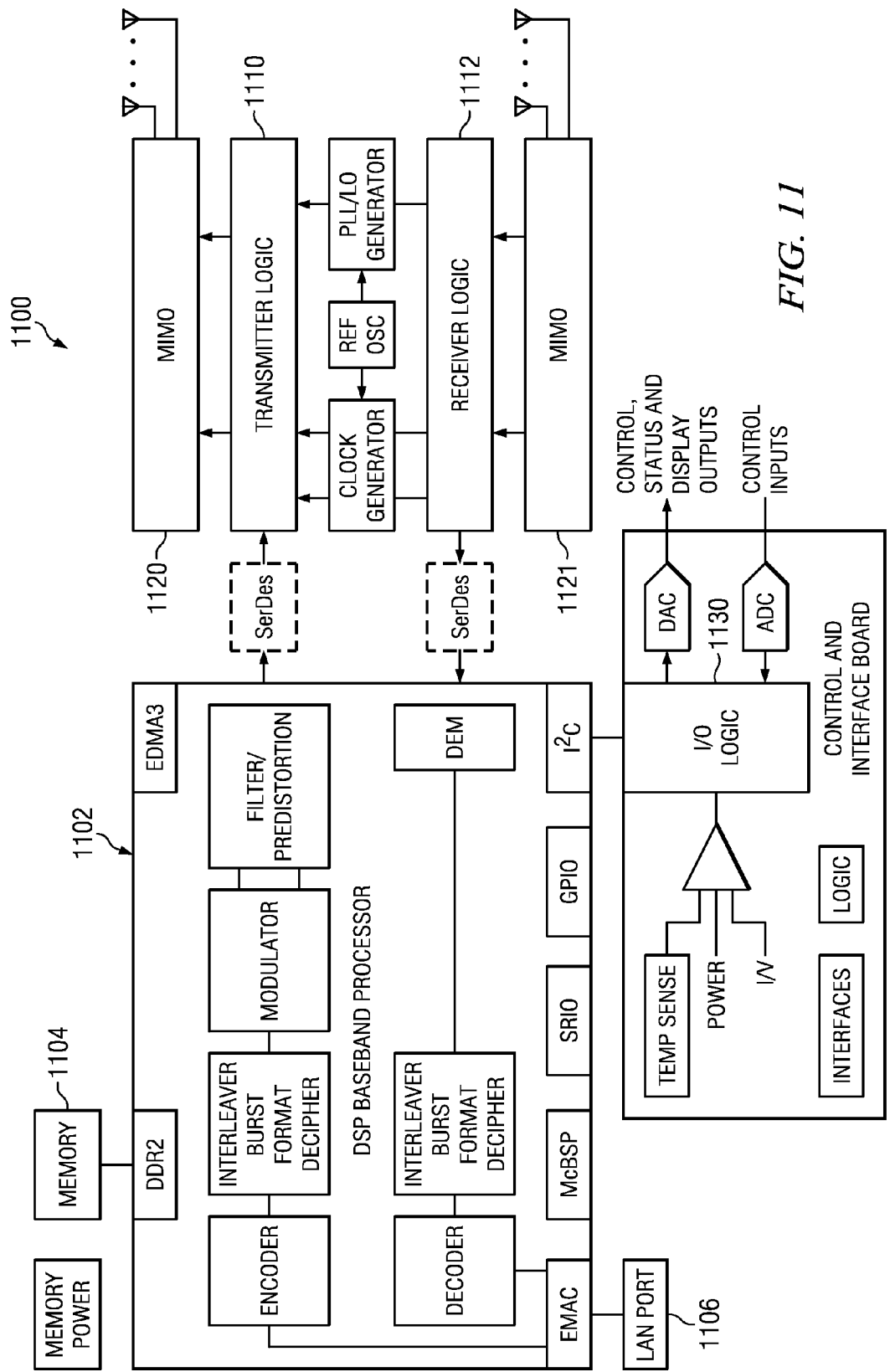
FIG. 11 is a block diagram of a system that includes the SoC of FIG. 1.

FIG. 11 is a block diagram of a base station for use in a radio network, such as a cell phone network. SoC 1102 is similar to the SoC of FIG. 1 and is coupled to external memory 1104 that may be used, in addition to the internal memory within SoC 1102, to store application programs and data being processed by SoC 1102. Transmitter logic 1110 performs digital to analog conversion of digital data streams transferred by the external DMA (EDMA3) controller and then performs modulation of a carrier signal from a phase locked loop generator (PLL). The modulated carrier is then coupled to multiple output antenna array 1120. Receiver logic 1112 receives radio signals from multiple input antenna array 1121, amplifies them in a low noise amplifier and then converts them to digital a stream of data that is transferred to SoC 1102 under control of external DMA EDMA3. There may be multiple copies of transmitter logic 1110 and receiver logic 1112 to support multiple antennas.

The Ethernet media access controller (EMAC) module in SoC 1102 is coupled to a local area network port 1106 which supplies data for transmission and transports received data to other systems that may be coupled to the internet.

An application program executed on one or more of the processor modules within SoC 1102 encodes data received from the internet, interleaves it, modulates it and then filters and pre-distorts it to match the characteristics of the transmitter logic 1110. Another application program executed on one or more of the processor modules within SoC 1102 demodulates the digitized radio signal received from receiver logic 1112, deciphers burst formats, and decodes the resulting digital data stream and then directs the recovered digital data stream to the internet via the EMAC internet interface. The details of digital transmission and reception are well known.

By making use of a distributed arbitration system to control accesses to shared resources by multiple requesters within processor modules of SoC 1102, data drops are avoided while transferring the time critical transmission data to and from the transmitter and receiver logic.

Input/output logic 1130 may be coupled to SoC 1102 via the inter-integrated circuit (I2C) interface to provide control, status, and display outputs to a user interface and to receive control inputs from the user interface. The user interface may include a human readable media such as a display screen, indicator lights, etc. It may include input devices such as a keyboard, pointing device, etc.

Other Embodiments

Although the invention finds particular application to Digital Signal Processors (DSPs), implemented, for example, in a System on a Chip (SoC), it also finds application to other forms of processors. A SoC may contain one or more megacells or modules which each include custom designed functional circuits combined with pre-designed functional circuits provided by a design library.

While the invention has been described with reference to illustrative embodiments, this description is not intended to be construed in a limiting sense. Various other embodiments of the invention will be apparent to persons skilled in the art upon reference to this description. For example, in another embodiment, more or fewer levels of arbitration hierarchy may be implemented. Some embodiments may include bandwidth management using maximum wait counters, while other embodiments may be implemented without such bandwidth management.

While a three bit priority value was described herein, in another embodiment more or fewer priority levels may be implemented. In another embodiment, higher priority values may indicate higher priority, for example.

In another embodiment, the shared resource may be just a memory that is not part of a cache. The shared resource may by any type of storage device or functional device that may be accessed by multiple masters in which access stalls by one master must not block access to the shared resource by another master.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein.

It is therefore contemplated that the appended claims will cover any such modifications of the embodiments as fall within the true scope and spirit of the invention.

What is claimed is:

1. A method for managing access to shared resources within a system comprising a plurality of requesters and a plurality of target resources, the method comprising:
    associating a separate arbitration with each of the plurality of target resources;
    assigning an access priority to each of the plurality of requesters;
    assigning a maximum wait count to each of the plurality of requesters;
    storing the maximum wait count of each of the plurality of requestors in a multi-bit field of a register;
    contending for access to a first target resource of the plurality of target resources by requests from two or more of the plurality of requesters using a first arbitration associated with the first target resource to determine a winning requester;
    providing a contention counter at the first arbitration for at least one of the requesters having a lower priority;
    performing a sequence of arbitration contests at the first arbitration for requests from the plurality of requesters for access to the first target resource;
    granting access to the first target resource to the winning requestor of each arbitration contest;
    incrementing the contention counter each time the lower priority requester loses an arbitration contest in a sequence of arbitration contests;
    elevating the priority of the lower priority requester when the contention counter reaches the corresponding maximum wait count;
    forwarding the priority of the request from the winning requester to be used while contending for access to the second target resource, said forwarded priority being an elevated priority if the winning requestor had an elevated priority;
    forwarding the request from the winning requester from the first target resource to a second target resource of the plurality of target resources; and
    contending for access to the second target resource by the forwarded request and requests from one or more of the plurality of requesters using a second arbitration associated with the second target resource.

2. The method of claim 1, wherein the maximum wait count of each of the plurality of requestors stored in the multi-bit field of the corresponding register is dynamically configurable.

3. The method of claim 1, further comprising providing a contention counter for the lower priority requester at more than one of the plurality of arbitrations.

4. The method of claim 1, wherein assigning access priority to each requester is dynamically configurable.

5. The method of claim 1, wherein the first target resource is a set of access tags for the second target resource.

6. A digital system comprising:
    two or more shared resources coupled in a sequential manner;
    a plurality of requesters coupled to access the shared resources, each requestor having a maximum wait count stored in a multi-bit field of a register and a contention counter;
    a first arbitration coupled to a first one of the shared resources and a second arbitration coupled to a second one of the shared resources;
    wherein the first arbitration is configured determine a winning request for access to the first shared resource from the plurality of requesters, and further configured to forward the winning request and priority information for the winning request to the second arbitration, the forwarded priority being an elevated priority if the winning requestor had an elevated priority;
    each of said first arbitration and said second arbitration incrementing each of said contention counters when a corresponding requestor loses arbitration, said priority of a requestor is elevated when the corresponding contention counter value reaches a value of said corresponding maximum wait count.

7. The system of claim 6, wherein the first shared resource comprises logic for checking tags for a cache and the second shared resource comprises memory of the cache.

8. The system of claim 6, further comprising weighting logic coupled to the first arbitration, wherein the arbitration is configured to grant access to the first shared resource in response to the weighting logic.

9. The system of claim 8, wherein a weighting value of the weighting logic is operable to be dynamically updated while the system is in operation.

10. The system of claim 8, wherein the weighting logic comprises a maximum wait counter.

11. The system of claim 6 being a system on a chip.

12. The system of claim 8, wherein the maximum wait count of each of the plurality of requestors is dynamically configurable.

* * * * *